United States Patent
Zink et al.

(10) Patent No.: US 9,897,724 B2
(45) Date of Patent: Feb. 20, 2018

(54) OPTICAL DEVICE AND METHOD OF IN SITU TREATING AN EUV OPTICAL COMPONENT TO ENHANCE A REDUCED REFLECTIVITY

(71) Applicant: KONINKLIJKE PHILIPS N.V., Eindhoven (NL)

(72) Inventors: Peter Zink, Aachen (DE); Christof Metzmacher, Aachen (DE); Rolf Theo Anton Apetz, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 244 days.

(21) Appl. No.: 14/816,106

(22) Filed: Aug. 3, 2015

(65) Prior Publication Data
US 2015/0338560 A1 Nov. 26, 2015

Related U.S. Application Data

(62) Division of application No. 12/602,798, filed as application No. PCT/IB2007/052224 on Jun. 12, 2007, now Pat. No. 9,110,390.

(51) Int. Cl.
*G02B 5/08* (2006.01)
*C23C 16/52* (2006.01)
(Continued)

(52) U.S. Cl.
CPC ............ *G02B 5/0816* (2013.01); *B82Y 10/00* (2013.01); *C23C 14/34* (2013.01); *C23C 16/52* (2013.01);
(Continued)

(58) Field of Classification Search
CPC .................................................... G02B 5/0816
See application file for complete search history.

(56) References Cited

U.S. PATENT DOCUMENTS

| | | | |
|---|---|---|---|
| 5,911,858 A | 6/1999 | Ruffner | |
| 6,736,943 B1 * | 5/2004 | Scobey | C23C 14/34 204/192.12 |

(Continued)

FOREIGN PATENT DOCUMENTS

| | | |
|---|---|---|
| JP | 2003133205 A | 5/2003 |
| JP | 2006351435 A | 12/2006 |

(Continued)

OTHER PUBLICATIONS

Kurt J. Lesker Company, "TORUS R&D Magnetron Sputtering Soruces", Oct. 12, 2005, http://www.lesker.com/newweb/deposition_sources/torus_sputtering_overview.cfm*

*Primary Examiner* — Timon Wanga

(57) ABSTRACT

The present invention relates to an optical device and a method of in situ treating an optical component (2, 6, 13) reflecting EUV and/or soft X-ray radiation in said optical device, said optical component (2, 6, 13) being arranged in a vacuum chamber (14) of said optical device and comprising one or several reflecting surfaces (3) having a top layer of one or several surface materials. In the method, a source (1, 5) of said one or several surface materials is provided in said chamber (14) of said optical device and surface material from said source (1, 5) is deposited on said one or several reflecting surfaces (3) during operation and/or during operation-pauses of said optical device in order to cover or substitute deposited contaminant material and/or to compensate for ablated surface material.

16 Claims, 2 Drawing Sheets

(51) Int. Cl.
 *C23C 14/34* (2006.01)
 *B82Y 10/00* (2011.01)
 *G03F 7/20* (2006.01)
 *G21K 1/06* (2006.01)

(52) U.S. Cl.
 CPC ....... *G02B 5/0891* (2013.01); *G03F 7/70033* (2013.01); *G03F 7/70916* (2013.01); *G03F 7/70925* (2013.01); *G21K 1/06* (2013.01); *C23C 14/3492* (2013.01)

(56) References Cited

U.S. PATENT DOCUMENTS

| | | |
|---|---|---|
| 2002/0051124 A1 | 5/2002 | Banine |
| 2002/0114880 A1* | 8/2002 | Dreistein .............. C23C 14/022 427/8 |
| 2004/0094412 A1 | 5/2004 | Navala |
| 2004/0104707 A1 | 6/2004 | May |
| 2005/0051421 A1 | 3/2005 | Quesnel |
| 2006/0138354 A1 | 6/2006 | Bakker |
| 2006/0193997 A1 | 8/2006 | Bykanov |
| 2006/0289808 A1* | 12/2006 | Partlo .................... B82Y 10/00 250/504 R |

FOREIGN PATENT DOCUMENTS

| | | |
|---|---|---|
| WO | 2004092693 A2 | 10/2004 |
| WO | 2005010617 A2 | 2/2005 |
| WO | 2006056730 A2 | 6/2006 |
| WO | 2007002374 A2 | 1/2007 |

* cited by examiner

OPTICAL DEVICE AND METHOD OF IN SITU TREATING AN EUV OPTICAL COMPONENT TO ENHANCE A REDUCED REFLECTIVITY

CROSS REFERENCE TO PRIOR APPLICATIONS

This application is a divisional application of U.S. Ser. No. 12/602,798, filed on May 6, 2010 which is a U.S. National Phase application under 35 U.S.C. § 371 of International Application No. PCT/IB2007/052224, filed on Jun. 12, 2007. These applications are hereby incorporated by reference herein.

FIELD OF THE INVENTION

The present invention relates to an optical device for EUV and/or soft X-ray radiation comprising at least one optical component in a vacuum chamber, which optical component has one or several reflecting surfaces with a top layer of one or several surface materials. The invention also relates to a method of in situ treating such an optical component reflecting EUV and/or soft X-ray radiation in an optical device in order to enhance a reduced reflectivity of the optical component.

BACKGROUND OF THE INVENTION

The present invention refers to the field of optical devices for the spectral range of extreme ultraviolet (EUV) and/or soft X-ray radiation comprising optical components with reflective surfaces for reflecting the EUV and/or soft X-ray radiation. Such optical devices are required, for example, for EUV lithography, in which grazing incidence mirrors and/or multilayer mirrors are arranged in a vacuum chamber between the radiation source and the wafer substrate to be irradiated. Typical materials used for the reflecting surfaces of the grazing incidence mirrors are for example ruthenium (Ru), palladium (Pd) or molybdenum (Mo). Multilayer mirrors for the above spectral range, which are suited for vertical or near vertical incidence, typically comprise a combination of layers of molybdenum and silicon (Si). Often also a top layer of ruthenium is applied for protecting the underlying layers.

A problem mainly arising during operation of optical devices with such reflecting optical components is the decrease of reflectivity over time. This reduction in reflectivity can be caused by contaminations of the reflecting surfaces due to debris from the radiation source or to reactions with gas remaining in the vacuum chamber during operation. Radiation sources for EUV lithography today are gas discharge plasmas or laser plasmas. The substances used for plasma generation, however, can move from the radiation source to the optical components and condense on the optical surfaces, thereby reducing their reflectivity. The material released from the radiation source and moving in the direction of the optical components is called debris. Other contaminations of the optical components can result from the fabrication process, transport or mounting of the optical components. Furthermore, the reflectivity of the reflecting surfaces can be reduced by an increased surface roughness, a reduced density or a reduced thickness of the reflecting layer or layers, due to the operation of the radiation source.

WO 2004/092693 A2 discloses a method and apparatus for debris removal from a reflecting surface of an EUV collector in an EUV lamp. In this method, a controlled sputtering ion source is created which comprises a gas with the atoms of the sputtering ion material and a stimulating mechanism causing the atoms of the sputtering ion material to exit in an ionized state. With this sputtering ion source the debris material deposited on the reflecting surfaces of the EUV collector is removed by sputtering. In order to avoid a removal of the top layer of the reflecting surface, the ionized state of the sputtering ion material is selected to have a distribution around a selected energy peak that has a high probability of sputtering the debris material and a very low probability of sputtering the material of the top layer of the reflecting surface.

SUMMARY OF THE INVENTION

An object of the present invention is to provide a method of in situ treating an optical component reflecting EUV and/or soft X-ray radiation in an optical device as well as a corresponding optical device, which allow an enhancement of a reduced reflectivity of the optical component and at the same time enhance the lifetime of the optical component.

The object is achieved with the method and the optical device according to a method of in situ treating an optical component (2, 6, 13) reflecting EUV and/or soft X-ray radiation in an optical device, said optical component (2, 6, 13) being arranged in a vacuum chamber (14) of said optical device and comprising one or several reflecting surfaces (3) having a top layer of one or several surface materials, the method comprising the steps of:

providing at least one source (1, 5) of said one or several surface materials in said chamber (14) of said optical device, and depositing surface materials from said source (1, 5) on said one or several reflecting surfaces (3) during operation and/or during operation pauses of said optical device in order to cover or substitute deposited contaminant material and/or to compensate for ablated surface material and an optical device for EUV and/or soft X-ray radiation, in particular an EUV and/or soft X-ray lamp, comprising at least one optical component (2, 6, 13) in a vacuum chamber (14), which optical component (2, 6, 13) has one or several reflecting surfaces (3) with a top layer of one or several surface materials, wherein the optical device comprises at least one source (1, 5) of said one or several surface materials, said source (1, 5) being usable to deposit surface materials in-situ on said one or several reflecting surfaces (3) during operation and/or during operation pauses of said optical device in order to cover or substitute deposited contaminant material and/or to compensate for ablated surface materials.

Advantageous embodiments of the method and the optical device are subject matter of a method according to the method described above, wherein said surface materials are deposited by chemical vapor deposition and a method according to the method described above, wherein said surface materials are deposited by sputter deposition and a method according to the method described above with the sputter deposition, wherein said source (1, 5) of said surface materials is moved close to said one or several reflecting surfaces (3) in operation pauses of said optical device and a method according to the method described above with the sputter deposition, wherein said source (1, 5) of said surface materials is provided as a target layer (5) on one or several non reflecting surfaces of said optical component (2, 6, 13) or of other optical components (6, 13) of said optical device and a method according to the methods using sputter deposition and the methods and where material is moving closer and the methods where materials are a target layer, wherein a buffer gas used for operation of said optical device is used as a working gas for sputter deposition and a method according to the method described above and the method of chemical vapor deposition and the method of sputtering, wherein a reflectivity of at least one of said one or several reflecting surfaces (3) is measured continuously or repeatedly and said surface material is only deposited when said reflectivity has decreased below a threshold value and the method according to the method described above and the method of chemical vapor deposition and the method of sputtering, wherein said optical device is an EUV and/or soft X-ray lamp and the method according to the method described above and the method of chemical vapor deposition and the method of sputtering, wherein said optical component (2, 6, 13) is a collector and the optical device according to the device described above, wherein said optical device comprises means for depositing surface materials from said source (1, 5) on said one or several reflecting surfaces (3) during operation and/or during operation pauses of said optical device and the optical device according to the optical device described above, wherein said source (1, 5) is arranged to be movable close to said one or several reflecting surfaces (3) in operation pauses of said optical device and the optical device according to the device with a movable source close the several reflecting surface wherein said means for depositing surface materials comprise a chemical vapor deposition system and the optical device according to the device described above, wherein said source (1, 5) of surface materials is a sputter target and said optical device comprises means for depositing surface material from said source (1, 5) on said one or several reflecting surfaces (3) by sputter deposition and the optical device according to the optical device where the source of surface materials is a sputter target, wherein said means for depositing surface materials include a DC and RF power supply (12) connected to said source (1, 5) of surface materials and to said optical component (2, 6, 13) and the optical device according to optical device where the source of surface materials is a sputter target or the optical device including a DC and RF power supply, wherein said sputter target comprises a target layer (5) on one or several non-reflecting surfaces of said optical component (2, 6, 13) or of other optical components (6, 13) of said optical device and the optical device according to the optical device having a target layer on one or more non-reflecting surfaces, wherein said optical component (2, 6, 13) is a collector (6) having several collector shells (7) and said target layer (5) is provided on back sides of said collector shells (7) and the optical device according to the device described above, wherein said optical component (2, 6, 13) is a collector (6) formed of one or several multilayer mirrors and the optical device according to the optical device for depositing surface material from said source on one or several reflecting surfaces during operation and/or pauses of the optical device and where the source of surface materials is a sputter target, wherein said optical device comprises means for measuring a reflectivity of at least one of said one or several reflecting surfaces (3) continuously or repeatedly and a control unit for controlling said means for depositing surface material in such a manner that said means deposit said surface material only when said reflectivity has decreased below a threshold value or is described in the subsequent part of the description and examples.

In the proposed method of in situ treating an optical component in an optical device, said optical component being arranged in a vacuum chamber of said optical device and comprising one or several reflecting surfaces having a top layer of one or several surface materials, a source of said one or several surface materials is provided in said vacuum chamber of said optical device and surface material from said source is deposited on said one or several reflecting surfaces during operation and/or during operation pauses of said optical device in order to cover or substitute deposited contaminant material and/or to compensate for ablated surface material.

In the proposed method, therefore, the one or several materials of the top layer of the one or several reflecting surfaces are deposited on these surfaces in situ, i.e. without disassembling the optical device. Due to this deposition of the surface materials, contaminations on the reflecting surface are covered by the surface materials, resulting in an improved reflectivity of this surface. Furthermore, since surface material of reflecting surfaces in EUV lamps may be ablated during operation, this ablated material is also compensated by the material deposited with the proposed method. This means that the reflecting layers of the optical devices will not lose their reflectivity due to erosion of these layers and therefore the lifetime of these optical components will be higher than the lifetime of optical components which are not treated with the proposed method.

The deposition of the material(s) can be achieved by various known methods, for example by evaporating the material from the material source or by (e.g. metal-organic) chemical vapor deposition of the material (CVD/MOCVD) or by a sputtering technique, in which a sputter target including the surface material is provided in the vacuum chamber. Using a sputtering technique it is also possible to generate ions of the surface material(s) with a high kinetic energy, so that some of these ions then replace the atoms or molecules of the contaminant material on the reflecting surface.

The present method can be applied continuously during operation of the optical device, after mounting and before the first use of the optical components of this optical device, repeatedly during operation or in operation pauses of the device as well as dependent on the reduction of reflectivity during operation. In the last case, the reflectivity of at least one of said one or several reflecting surfaces preferably is measured continuously or repeatedly. The surface material then is only deposited when said reflectivity has decreased below a threshold value, which can be set by the operator. When measuring the reflectivity, it is possible to measure the reflectivity in the EUV or soft X-ray spectral range. It is also possible to measure the reflectivity in other wavelength ranges, provided that the reflectivity in these wavelength ranges is also an indication of the reflectivity in the EUV and/or soft X-ray radiation range. Nevertheless, also other types of measurements can be performed in order to derive a reduction in reflectivity. Such measurements can include the measurement of the gas composition in the optical device, for example the proportion of mirror material in the gas, the use of a crystal balance, the use of a diffractometer, the use of energy dispersive X-ray analysis or the use of spectroscopic ellipsometry.

In a preferred embodiment, the source of one or several surface materials is provided as a sputter target in the vacuum chamber of the optical device. The deposition of said surface materials is then performed by sputter deposition using an appropriate sputtering gas, in particular an inert gas like argon (Ar), which normally is used as a buffer gas during operation of the optical device. This gas can be ionized by known means, for example by light (e.g., UV, VUV or EUV), by the generation of microwaves around the optical components, by applying an RF field between the target and the optical components or between the optical components and a further electrode arranged in the vacuum chamber. Furthermore, also an ion gun can be used to provide the necessary sputtering ions. The sputtering can be performed continuously or pulsed, with or without a magnetron unit or an additional reactive gas. Moreover, the application of an rf substrate bias to control ion bombardment and substrate cooling or heating to affect surface mobility and diffusion are feasible.

The sputter target can be provided as a separate component arranged in the optical device. In this case, the separate component preferably is movable between a position close to the reflecting surface for sputter deposition and away from this surface for normal operation of the optical device. In a preferred embodiment, at least one of several sputter targets is provided as a layer of the substrate material on surfaces of optical components of the optical device, which surfaces are not used for reflecting the EUV and/or soft X-ray radiation.

The proposed optical device has at least one optical component in a vacuum chamber, which optical component has one or several reflecting surfaces with a top layer of surface materials, e.g. Ru or Mo/Si multilayers. The optical device, which is preferably an EUV lamp, for example for EUV lithography, comprises at least one source of said one or several surface materials, said source being usable or operable to deposit surface material on said one or several reflecting surfaces during operation and/or during operation pauses of said optical device in order to cover or substitute deposited contaminant material and/or to compensate for ablated surface material.

The optical device preferably also comprises the means for depositing surface material from said source on the one or several reflecting surfaces. These means preferably are electrical means for evaporating said material(s) from said source or for ionizing a sputtering gas and sputtering said surface material(s) from a sputter target. To this end, the optical component or part of this optical component is connected to the electrical means in order to apply an RF voltage between the reflective surface and the sputter target. Furthermore, also a DC voltage can be applied to generate a DC bias at the reflecting surface.

Preferably, said source of surface materials is arranged to be movable between at least two positions inside said vacuum chamber of said optical device. One position is a position close to the reflecting surface in order to achieve an optimized material deposition on this surface. The other position is a position away from this surface in order to achieve an operation of the optical device without disturbance by the source.

The optical device can include a control unit controlling the deposition of said surface material(s) on the reflecting surfaces. Preferably, means for measuring the reflectivity of at least one of the reflecting surfaces are provided in said optical device, wherein said control unit controls the means for depositing surface material in such a manner that said means deposit said surface material(s) only when said reflectivity has decreased below a preset threshold value. The control unit can also control the movement of the source of material(s) between the two positions.

In a preferred embodiment, said optical device contains an EUV collector having several shells for collecting EUV and/or soft X-ray radiation from a corresponding radiation source. In this embodiment, the front sides of the collector shells represent the reflecting surfaces, while the back sides of these shells do not contribute to the reflection. The back sides are covered with a thick layer of the surface material and serve as a sputter target for the sputter deposition. An additional dummy shell is placed close to the reflecting surface of the inner layer of the collector and is also covered with the surface material on its back side. The one or several surface materials from the back sides are then sputtered according to the proposed method and deposit on the front sides, i.e. on the reflecting surfaces, of the corresponding opposing collector shells.

In the present description and claims, the word "comprising" does not exclude other elements or steps, and the indefinite article "a" or "an" does not exclude a plurality. Also, any reference signs in the claims shall not be construed as limiting the scope of these claims.

BRIEF DESCRIPTION OF THE DRAWINGS

The following embodiments show examples of the present method and of a corresponding optical device with reference to the accompanying drawings, without limiting the scope of the invention. The drawings show.

DESCRIPTION OF PREFERRED EMBODIMENTS

The present method and the corresponding device are explained hereinbelow by means of an example of an EUV lamp which is used for EUV lithography. In such a lamp, hot plasma is generated to emit the desired EUV radiation, which is focused by a collector and may be deflected by one or more further optical components. The collector in this example comprises several shells of grazing incidence mirrors having reflecting surfaces made of a metallic ruthenium layer. The further optical components have a multilayer reflecting surface which is covered by a protecting top layer of ruthenium. Although the proposed method is explained by means of the example of ruthenium as a surface material, it is clear that the method is also applicable to other surface materials used as reflecting or protecting layers in the EUV or soft X-ray spectral range.

During operation of such an EUV lamp, debris from the plasma source, for example tin, escapes towards the optical components and may deposit on the reflecting surfaces. The reflectivity of the collector and other optical components is reduced by this deposition of contaminant material. After this reduction in reflectivity has reached a preset threshold value, the reflective surfaces are in situ treated using the proposed method.

Figure 1:
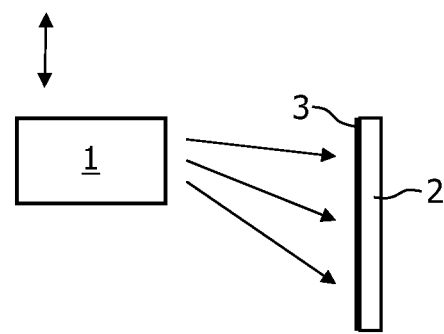
FIG. 1 a schematic view of the principle of the present method.

To this end, a ruthenium source 1 is arranged in the optical device away from the optical path of the EUV lamp. Ruthenium source 1 is then moved close to the reflecting surface 3 of the optical component 2 to be treated, as schematically indicated in FIG. 1. Ruthenium source 1 can be, for example, a sputter target or an evaporator. The ruthenium is then sputtered or evaporated from the source 1 and deposits on the reflecting surface 3. Contaminant material on this surface, for example tin, is covered with the deposited ruthenium. In the same way, also ablation of ruthenium material from the reflecting surface by erosion during operation of the EUV lamp is compensated for by depositing the additional ruthenium on this reflecting surface.

Figure 2:
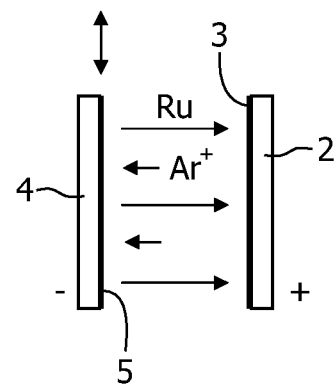
FIG. 2 a schematic view of the principle of sputter deposition as an example of the present method.

FIG. 2 shows an example in which the ruthenium source is a sputter target formed of a carrier substrate 4 covered by a thick target layer 5 of ruthenium. The carrier substrate 4 and the optical component 2 are connected to a power supply for generating DC and AC (RF) voltages. Carrier substrate 4 serves as the cathode and optical component 2 as the anode, as is generally known from the field of physical vapor deposition. Between anode and cathode a working gas, for example argon, is present. The argon atoms are ionized by the applied RF voltage and the argon ions are accelerated, for example at 300 eV, towards the target layer 5 to discharge free ruthenium atoms at a few eV. In the present example, optical component 2 is shown with a plane reflecting surface 3. For optical components with such an easily accessible geometry, as is often the case for example with multilayer mirrors, the sputter target can have the same design and can be moved in front of and oriented parallel to the reflecting surface 3 to be treated, as shown in FIG. 2.

If the applied RF and/or DC voltage is selected such that ruthenium ions are generated, sputtering of the reflecting surface can be achieved, as a result of which the contaminant materials are removed from this surface and substituted by the ruthenium ions. The sputter efficiency of ruthenium is approximately 1 at ion energies of about 1 keV. This means that for each ruthenium ion one atom of the contaminant material or one ruthenium atom of the top layer of the reflecting surface is removed. Consequently, after an appropriate treating time, a relatively pure ruthenium layer is achieved.

Figure 3:
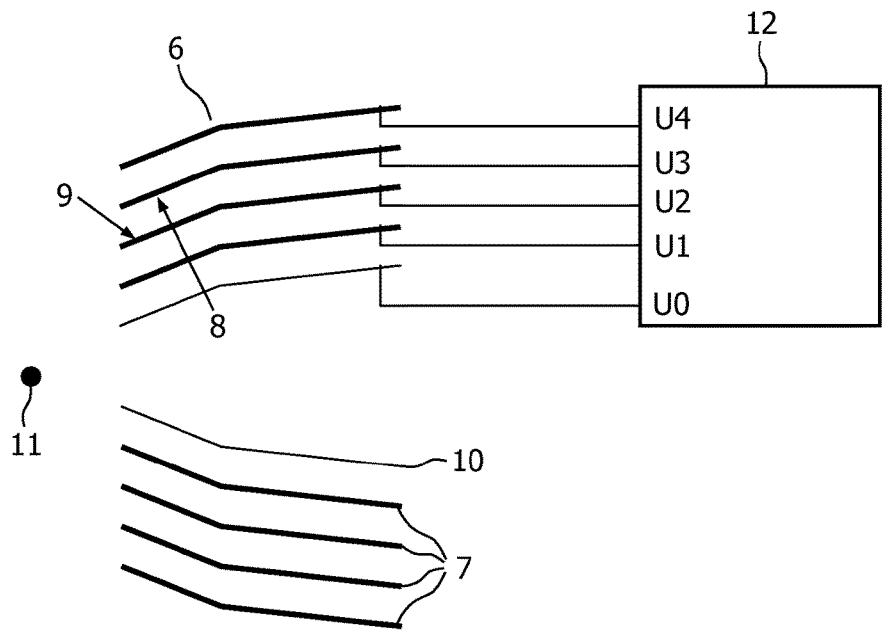
FIG. 3 an example of the proposed optical device in a partial view.

At least one of several target layers of the ruthenium source can also be provided on non-reflecting surfaces of the optical components, i.e. surfaces which are not used during operation of the EUV lamp. FIG. 3 shows such an example of an optical device, in which back sides of a collector 6 are used as the sputter target. EUV radiation emitted from radiation source 11, a plasma source, is focused by the collector 6. Collector 6 comprises four collector shells 7. The front side 8 of each shell 7 has a reflecting surface; the back side 9 is not used for reflecting radiation. The back sides 9 of the shells 7 of the collector 6 are covered with a thick target layer of ruthenium, and the reflecting surfaces of the front sides are also made of a ruthenium layer. The target layers can be applied galvanically. In addition to the four collector shells 7, a dummy shell 10 is provided in front of the inner shell. The dummy shell 10 has the same target layer on the back side as the other shells; the front side of this dummy layer, however, does not have any function.

Shells 7 of collector 6 are electrically isolated and connected to a power supply 12. This power supply 12 generates a direct current (bias) as well as an RF alternating current for generating plasma between the shells. A working gas, for example argon, is present between the shells. This working gas is used as a buffer gas during operation of the EUV lamp. The DC potentials U1, U2, U3 and U4 of the different shells are selected such that the front side 8 of each shell 7 is charged positively against the back side of the opposing shell. This means that U0>U1>U2>U3>U4. During operation of the power supply 12, the argon gas is ionized between the shells, thereby sputtering the ruthenium atoms from the back sides, which ruthenium atoms then deposit on the front sides of the shells, i.e. on the reflecting surfaces.

This procedure can be performed during normal operation of the EUV lamp. It is however preferred to perform this sputter deposition only during operation pauses of the EUV lamp. Furthermore, it is not in any case necessary to generate the sputtering plasma between each of the shells at the same time. It is also possible to treat the single shells one after another. In this case, the DC and RF voltages are applied at the same time only between one pair of opposing shells and are subsequently switched to another pair of opposing shells and so on.

Figure 4:
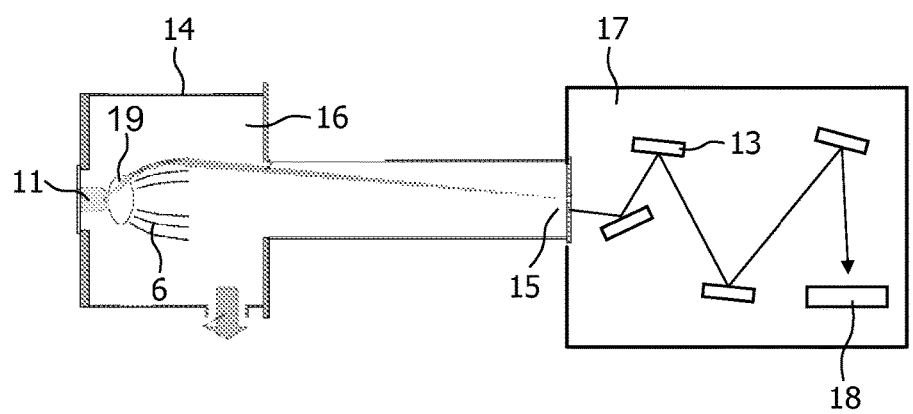
FIG. 4 a schematical configuration of an EUV irradiation unit.

FIG. 4 schematically shows a typical layout of an EUV lithography system with a corresponding EUV lamp. The EUV lamp basically consists of the radiation source 11, the collector 6 and multilayer mirrors 13 in a vacuum vessel 14. The radiation emitted from the radiation source 11 is collected by the reflective collector 6 and focused on an intermediate focus 15. At the position of this intermediate focus 15 an aperture connects the first volume 16 with a second volume 17 of the EUV lamp. In this second volume 17 the multilayer mirrors 13 are arranged to guide the radiation from the intermediate focus 15 to the lithography mask (not shown) and the wafer substrate 18. In most EUV lithography systems, means 19 for debris mitigation are arranged between the radiation source 11 and the collector 6. In such an EUV lamp, the collector 6 can be designed as described in connection with FIG. 3 in order to continuously or repeatedly enhance the reduced reflectivity of the reflective surfaces.

LIST OF REFERENCE SIGNS

1 ruthenium source
2 optical component
3 reflecting surface
4 carrier substrate
5 target layer
6 collector
7 shell
8 front side
9 back side
10 dummy shell
11 radiation source
12 power supply
13 multilayer mirrors
14 vacuum vessel
15 intermediate focus
16 first volume
17 second volume
18 substrate
19 means for debris mitigation

The invention claimed is:
1. An optical device comprising
at least one optical component in a vacuum chamber,
wherein the optical component emits at least one of EUV and soft X-ray radiation during a period of operation,
wherein the optical component comprises a plurality of collectors,
wherein each collector includes a first surface and an opposite second surface,
wherein each first surface is reflective and comprises a top layer of at least one surface material,
a material source comprising the at least one surface material,
wherein the material source is situated on the second side of at least one of the plurality of collectors, and
an activation source,
wherein, when activated by the activation source, the material source deposits the at least one surface material in-situ upon the first surface of at least one of the plurality of collectors.

2. An optical device comprising:
at least one optical component in a vacuum chamber,
wherein the optical component emits at least one of EUV and soft X-ray radiation during a period of operation, and
wherein the optical component comprises at least one reflective surface comprising a top layer of at least one surface material;
an activation source;
a material source comprising the at least one surface material,
wherein, when activated by the activation source, the material source deposits the at least one surface material in-situ upon the at least one reflective surface of the optical component,
wherein the material source is arranged to be movable away from the at least one reflecting surface during the period of operation and close to the at least one reflecting surface during pauses of operation of the optical component.

3. The optical device of claim 1, wherein the material source is situated on the second surface of multiple collectors of the plurality of collectors, and, wherein, when irradiated by the radiation source, the material source deposits the at least one surface material upon the first surfaces of the multiple collectors.

4. The optical device of claim 1, wherein the optical device activates the activation source during the period of operation of the optical component.

5. The optical device of claim 1, wherein the activation source activates the activation source during a period of non-operation of the optical component.

6. The optical device of claim 1, wherein the activation source comprises a chemical vapor source, and the material source deposits the at least one surface material by chemical vapor deposition.

7. The optical device of claim 1, wherein the activation source comprises a radiation source, and the material source is a sputter target that deposits the at least one surface material by sputter deposition when the material source is irradiated.

8. The optical device of claim 1, wherein the activation source comprises a radio frequency (RF) power supply coupled to the material source, and a gas that provides accelerated ions that discharge the at least one surface material from the material source.

9. The optical device of claim 1, wherein each collector comprises a multilayer mirror.

10. The optical device of claim 1, wherein the plurality of collectors forms a plurality of concentric shells.

11. The optical device of claim 1, further comprising a measurement device that provides a measure of reflectivity of the optical device, and wherein the optical device activates the activation source in dependence upon the measure of reflectivity.

12. The optical device of claim 2, wherein the activation source activates the activation source during the operation pauses of the optical component.

13. The optical device of claim 2, wherein the activation source comprises a chemical vapor source, and the material source deposits the at least one surface material by chemical vapor deposition.

14. The optical device of claim 2, wherein the activation source comprises a radiation source, and the material source is a sputter target that deposits the at least one surface material by sputter deposition when the material source is irradiated.

15. The optical device of claim 2, wherein the activation source comprises a radio frequency (RF) power supply coupled to the material source, and a gas that provides accelerated ions that discharge the at least one surface material from the material source.

16. The optical device of claim 2, further comprising a measurement device that provides a measure of reflectivity of the optical device, and wherein the optical device activates the activation source in dependence upon the measure of reflectivity.

* * * * *